United States Patent
Lu et al.

(10) Patent No.: US 7,759,988 B2
(45) Date of Patent: Jul. 20, 2010

(54) FREQUENCY MULTIPLIER

(75) Inventors: Yumin Lu, Chelmsford, MA (US); Robert Ian Gresham, Somerville, MA (US)

(73) Assignee: Autoliv ASP, Inc., Ogden, UT (US)

( * ) Notice: Subject to any disclaimer, the term of this patent is extended or adjusted under 35 U.S.C. 154(b) by 123 days.

(21) Appl. No.: 11/963,708

(22) Filed: Dec. 21, 2007

(65) Prior Publication Data

US 2009/0160502 A1 Jun. 25, 2009

(51) Int. Cl.
*H03B 19/00* (2006.01)

(52) U.S. Cl. .......................... 327/119; 327/116; 377/47

(58) Field of Classification Search .................. 327/114, 327/116, 119–123; 331/53; 377/47, 48
See application file for complete search history.

(56) References Cited

U.S. PATENT DOCUMENTS

| 6,707,344 | B2 | 3/2004 | Cargill et al. | |
| 6,864,728 | B1* | 3/2005 | Lu | 327/122 |
| 7,091,757 | B2* | 8/2006 | Masuda | 327/122 |
| 7,164,324 | B2 | 1/2007 | Guebels | |
| 7,245,164 | B2* | 7/2007 | Ito | 327/116 |
| 2006/0145737 | A1* | 7/2006 | Yamamoto et al. | 327/119 |

OTHER PUBLICATIONS

Danesh et al., Differential VCO and Frequency Tripler using SiGe HBTs for the 24 GHz ISM Band, 2003 IEEE Radio Frequency Integrated Circuits Symposium, 0-7803-7694-3/03/$17.00—2003 IEEE.

* cited by examiner

*Primary Examiner*—Lincoln Donovan
*Assistant Examiner*—Patrick O'Neill
(74) *Attorney, Agent, or Firm*—Sally J Brown; Small Patent Law Group, LLP

(57) ABSTRACT

A frequency multiplier is provided that includes a switching component having a plurality of differential pairs of transistors. The frequency multiplier further includes a gain stage. A common mode feedback generated by the switching component is also provided to the gain stage.

17 Claims, 2 Drawing Sheets

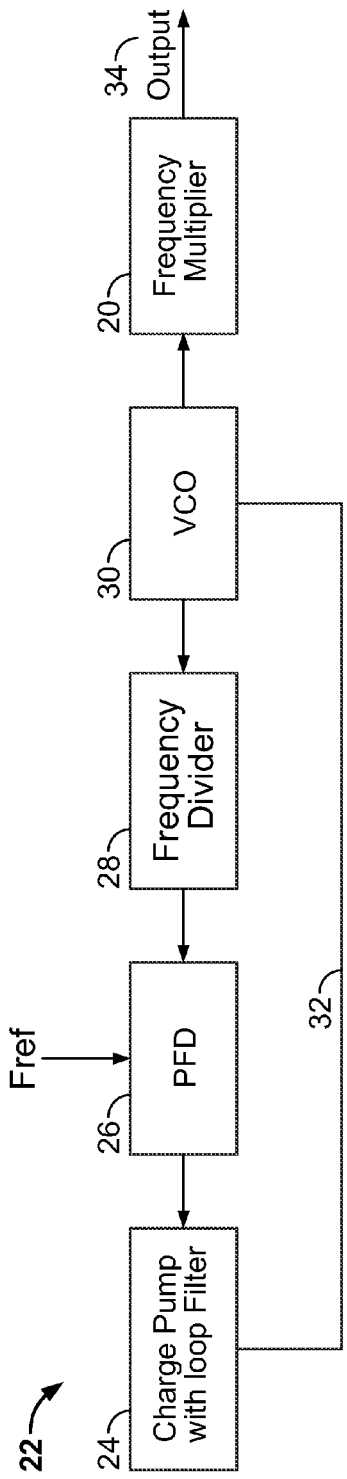
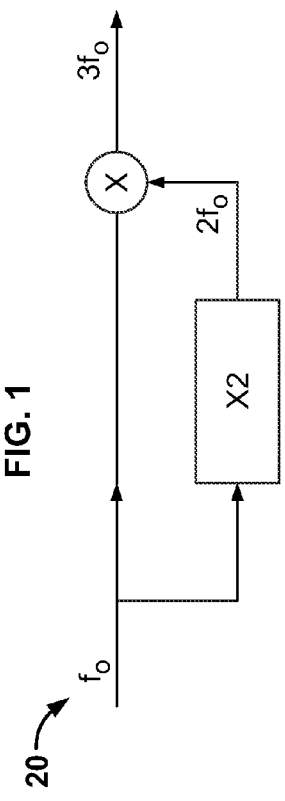
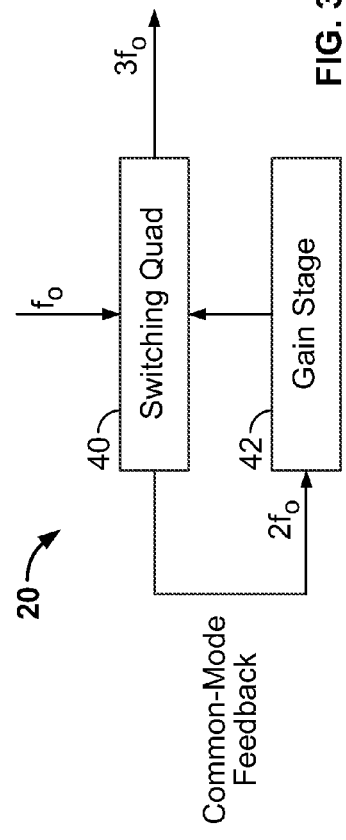
FIG. 1
FIG. 2
FIG. 3

FREQUENCY MULTIPLIER

BACKGROUND OF THE INVENTION

This invention relates generally to frequency multipliers, and more particularly, to a frequency multiplier having a common-mode feedback.

Frequency multipliers are commonly used in radio applications (e.g., radio transmitter or receiver) and other radio frequency (RF) applications, such as radar applications (e.g., automotive radar) to multiply the base frequency of an oscillator by a predetermined factor (e.g., factor of 2 or 3). The multiplied frequency is driven in a final stage to produce a signal output, for example, to an antenna. Frequency multipliers allow the use of a stable frequency reference source (e.g., a crystal oscillator or on-chip voltage controlled oscillator (VCO)), to generate frequencies which may be difficult to produce directly from the VCO (e.g., 24 GHz operation). In digital applications, frequency multipliers are often used in phase-locked loops to generate a desired frequency from an external reference frequency.

Known frequency multipliers, for example, frequency triplers that triple the input frequency, typically operate by driving one or more transistors to a nonlinear region of operation. In this nonlinear region of operation, higher order harmonics are generated. A bandpass filter is then used to output the desired harmonic frequency based on the desired frequency factor multiple. For example, in a frequency tripler, the bandpass filter outputs third harmonics while suppressing the other frequency components (i.e., harmonics). However, these known frequency multipliers require a substantial input power in order to drive the transistor hard enough to generate the desired harmonics. Additionally, the efficiency of generating the harmonics in these known frequency multipliers is typically low and becomes worse as the frequency increases, thereby also degrading system performance.

BRIEF DESCRIPTION OF THE INVENTION

In accordance with an exemplary embodiment of the invention, a frequency multiplier is provided that includes a switching component having a plurality of differential pairs of transistors. The frequency multiplier further includes a gain stage. A common mode feedback generated by the switching component is also provided to the gain stage.

In accordance with another exemplary embodiment of the invention, an apparatus is provided that includes a signal generator configured to generate an input signal. The apparatus further includes a frequency multiplier configured to generate a frequency multiplied output signal from a single input signal of the signal generator.

In accordance with yet another exemplary embodiment of the invention, a method for generating a multiplied frequency signal is provided. The method includes switching pairs of differential transistors with a single input signal, generating harmonics based on the switching and generating a common-mode feedback based on even harmonics from the generated harmonics. The method further includes amplifying the common-mode feedback harmonics with a gain stage to generate an amplified common-mode signal and using the amplified common-mode signal with the single input signal to generate a multiplied frequency signal.

The method includes switching pairs of differential transistors with a single input signal, generating harmonics based on the switching and generating a common-mode feedback based on the harmonics. The method further includes combining the common-mode feedback with the single input signal to generate a multiplied frequency signal.

BRIEF DESCRIPTION OF THE DRAWINGS

FIG. 1 is a block diagram of a phase locked loop (PLL) including a frequency multiplier constructed in accordance with various embodiments of the invention.

FIG. 2 is a block diagram illustrating frequency multiplying in accordance with various embodiments of the invention.

FIG. 3 is a simplified block diagram of a frequency multiplier constructed in accordance with various embodiments of the invention.

DETAILED DESCRIPTION OF THE INVENTION

Figure 4:
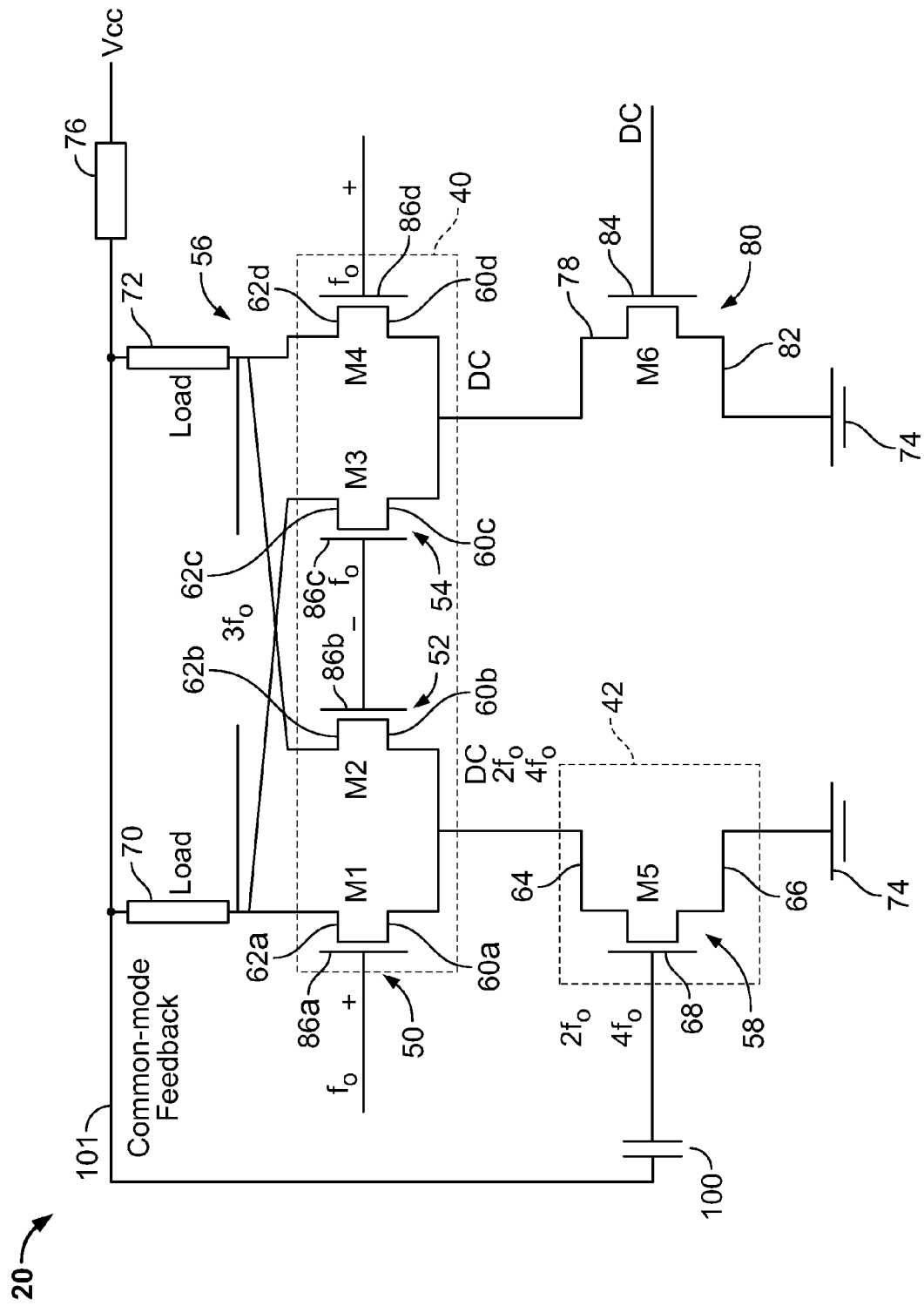
FIG. 4 is a detailed schematic block diagram of a frequency multiplier constructed in accordance with various embodiments of the invention.

For simplicity and ease of explanation, the invention will be described herein in connection with various embodiments thereof. Those skilled in the art will recognize, however, that the features and advantages of the various embodiments may be implemented in a variety of configurations. It is to be understood, therefore, that the embodiments described herein are presented by way of illustration, not of limitation.

As used herein, an element or step recited in the singular and proceeded with the word "a" or "an" should be understood as not excluding plural said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property. Additionally, the arrangement and configuration of the various components described herein may be modified or changed, for example, replacing certain components with other components or changing the order or relative positions of the components.

Various embodiments of the present invention provide a frequency multiplier for generating multiples of an input frequency. The frequency multiplier in the various embodiments uses a common-mode feedback to generate the frequency multiples (e.g., frequency tripling). A gain stage is also provided to improve efficiency.

In various embodiments, a frequency multiplier 20 is provided that may form part of a frequency synthesizer having a phase locked loop (PLL) 22 as shown in FIG. 1. The PLL 22 includes a charge pump 24, the input of which is connected to the output of a phase frequency detector (PFD) 26. The input of the PFD 26 is connected to the output of a frequency divider 28. The input of the frequency divider 28 is connected to a voltage controlled oscillator (VCO) 30. A feedback loop 32 is also provided from the output of the charge pump 24 to the control input of the VCO 20, for example, to provide a negative feedback configuration. The frequency multiplier 20 connected to the VCO 30 may triple the output frequency from the VCO 30 from 8 GHz to 24 GHz.

It should be noted that although the frequency multiplier 20 is described in connection with the PLL 22 for multiplying the frequency of the output of the VCO 30 shown in FIG. 1, the frequency multiplier 20 may be provided in connection with different PLLs having different components parts. The frequency multiplier 20 also may be used in different applications having different frequency operating requirements, for example, different frequency multiplier requirements. For example, the frequency multiplier 20 may be used as part of a frequency synthesizer in radio, telecommunications, computers and other electronic applications (e.g., automotive radar application) to generate stable higher frequencies. The PLL 22 may be implemented in hardware, for example, a single integrated circuit chip, in software, or in a combination thereof.

In operation, the phase of the VCO 30 at an output 34 is locked using the PLL 22 and based on an input signal, for example, an input frequency signal (Fref, also referred to as $f_o$) received at the phase frequency detector 26. The PLL 22 is essentially an electronic control system that generates a signal that is locked to the phase of the input or reference signal multiplied by a factor using the frequency multiplier 20. The PLL 22 responds to both the frequency and the phase of the input signal and automatically increases or decreases the frequency of the VCO 30 until the output frequency of the VCO 30 is matched to the multiplied reference signal in both frequency and phase (which may include an acceptable deviation). It should be noted that the VCO 30 generates a periodic output signal and the charge pump 24 sends a control signal to the VCO 30. For example, if the VCO 30 is initially at about the same frequency as the reference signal (increased by a multiplied factor), then if the phase from the VCO 30 falls behind, the control voltage of the charge pump 24 is changed based on the change in frequency as detected by the PFD 26. The frequency of the VCO 30 is accordingly increased (e.g., oscillation speeds up). If the phase moves ahead, the control voltage is again changed, but to decrease the frequency of the VCO 30 (e.g., oscillation slows down).

The frequency multiplier 20 may be, for example, a frequency tripler that triples the input frequency as shown in FIG. 2. Specifically, an input signal ($f_o$) is combined with a common mode signal as described in more detail below. The common mode signal, which in various embodiments are based on even harmonics (e.g., $2^{nd}$ harmonic, $4^{th}$ harmonic, etc.), are used to generate, for example, $2f_o$ and $4f_o$ currents (only $2f_o$ is shown in FIG. 2 because the frequency multiplier is a frequency tripler). In this example, the $2f_o$ component is then mixed with the input signal $f_o$ to generate an output of $3f_o$. Thus, the output frequency is triple that of the reference frequency ($f_o$). If the $4f_o$ component of the common mode signal is used, then the frequency of the output is five times that of the input frequency ($f_o$). Thus, a factor multiple of a fundamental frequency may be generated using only the single input reference frequency signal.

In one embodiment as shown in FIG. 3, the frequency multiplier 20 generally includes a switching component 40, for example, a switching quad component and a gain stage 42. The switching component 40 may be, for example, four transistors are arranged as in a typical Gilbert cell mixer that operates to mix the input signal ($f_o$) and a signal (e.g., $2f_o$) from the gain stage 42 that is generated from the common mode feedback signal from the switching component 40. In one embodiment, the common mode signal of the even harmonics from the switching component 40 are fed back to the gain stage 42, which then generates an amplified current at $2f_o$. This current at $2f_o$ mixes with the input signal $f_o$ to generate the output from the switching component 40, which in this embodiment is $3f_o$.

One embodiment of the frequency multiplier 20 is shown in FIG. 4 wherein the switching component 40 comprises a first transistor (M1) 50, a second transistor (M2) 52, a third transistor (M3) 54 and a fourth transistor (M4) 56 arranged as differential pairs of transistors. In the various embodiments, the transistors 50-56 may be any type of transistor, for example, a field-effect transistor (FET), a bipolar junction transistor (BJT), etc. In the illustrated embodiment, M1 50 and M2 52 are configured in an opposed arrangement and M3 54 and M4 56 are configured in an opposed arrangement to define the differential pairs. In this opposed arrangement, the source 60a and 60b of each of M1 50 and M2 52, respectively, and the source 60c and 60d of each of M3 54 and M4 56, respectively, are connected. The drain 62a and 62c of each of the M1 50 and M3 54, respectively, are connected to a first load 70 (e.g., a first inductor) and the drain 62c and 62d of each of M2 52 and M4 56, respectively, are connected to a second load 72 (e.g., a second inductor).

M1 50 and M2 52 are also connected to the gain stage 42. In particular, M1 50 and M2 52 are connected to a fifth transistor (M5) 58. Specifically, the source 60a and 60b of each of M1 50 and M2 52, respectively, are connected to the drain 64 of M5 58. The source 66 of M5 58 is connected to ground 74. The gate 68 of M5 58 is connected through a capacitor 100 to each of the first and second loads 70 and 72 to define the common-mode feedback. The first and second loads 70 and 72 are also connected to a voltage source (Vcc) through a third load 76 (e.g., a third inductor). The gate 68 of M5 58 is connected to the opposite end of the loads 70 and 72 from the drains 62a-62d of MI through M4 50-56.

In order to provide a balanced topology to the frequency multiplier 30, the source 60c and 60d of each of M3 54 and M4 56, respectively, are connected to a drain 78 of a sixth transistor (M6) 80. The source 82 of M6 80 is connected to ground 74 and the gate 84 of M6 80 is connected to a voltage source that provides a DC bias voltage.

In operation, the input signal ($f_o$) is applied to the gates 86a-86d of each of M1 through M4 50-56. It should be noted that the input signal ($f_o$) applied to M1 50 and M3 54 is out of phase (differential) and the input signal ($f_o$) applied to M2 52 and M4 56 is out of phase (differential). In one embodiment, the input signal ($f_o$) is 180 degrees out of phase such that when a positive input signal ($+f_o$) is applied to M1 50, a negative input signal ($-f_o$) is applied to M3 54 and vice versa. In the same manner, when a positive input signal ($+f_o$) is applied to M4 56, a negative input signal ($-f_o$) is applied to M2 52 and vice versa.

During one half of the signal cycle of the input signal ($f_o$), for example, when M1 50 is biased on, M2 52 is biased off, M3 54 is biased off and M4 56 is biased on. The biasing is the opposite for the other half cycle of the input signal ($f_o$), which may be, for example, a sinusoidal wave signal. Thus, each of the M1 through M4 50-56 are on for half of the cycle of the input signal ($f_o$) and off for the other half of the cycle of the input signal ($f_o$).

Thus, with the gates 86a-86d of M1 through M4 50-56 driven in this manner, the only current that can flow out of node 101 is even harmonic current, which is common-mode, for example, $2f_o$, $4f_o$, etc. These common-mode harmonics are the fed back to M5 58, which generates amplified currents at, for example, $2f_o$, $4f_o$, etc. It also should be noted that DC current also flows at the source 60a and 60b of M1 50 and M2 52, respectively. These amplified currents then mix with the input signal $f_o$ such that at each of the first and second loads 70 and 72 on the side of the drains 62a-62d of each of M1 through M4 50-56, a current of $3f_o$ is generated, which may be output as the output signal, the frequency of which is multiplied by a factor of three. It should be noted that the output signal is a differential signal. The other mixing product between $2f_o$ and $f_o$ is a component at $f_o$ that is also differential. The component of $f_o$ at the output can be attenuated with a high pass matching network. Thus, in this embodiment, the frequency multiplier 20 is a frequency tripler. In other embodiments, and for example, if the $4f_0$ current is combined with the input current $f_0$, then an output current of $5f_0$ can be generated. In these embodiments, the gain stage M5 58 will have much less gain at $4f_0$ as compared to at $f_0$.

It should be noted that the even harmonics are canceled by the balanced topology and do not show up at the output. This is because the even harmonic components are in-phase (assuming ideal matching between M1 through M4 50-56) and therefore will not result in a differential output. It further should be noted that the current through M5 58 has a DC component that would otherwise mix with the input signal ($f_0$) and generate an undesirable fundamental component at the output. In the embodiment of FIG. 4, M3 54, M4 56 and M6 80 are used to cancel this undesirable fundamental component.

Thus, the frequency multiplier 20 of the various embodiments provides common mode feedback that allows frequency multiplying (e.g., frequency tripling) using a single input signal (e.g., $f_0$) by mixing the input signal with generated harmonic signals. Moreover, higher efficiency is provided by the gain stage 42 by amplifying the common mode feedback.

It further should be noted that modifications and variations to the various embodiments are contemplated. For example, the number, relative positioning and operating parameters of the various components may be modified based on the particular application, use, etc. The modification may be based on, for example, different desired or required operating characteristics, such as the desired frequency factor multiple.

Accordingly, it is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Moreover, the dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description.

The scope of the various embodiments of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. A frequency multiplier comprising:
   a switching component having a plurality of differential pairs of transistors; and
   a gain stage wherein a common mode feedback generated by the switching component is provided to the gain stage, the common mode feedback is combined with an input signal to the switching component to generate a frequency multiplied output signal, wherein the frequency is multiplied by three times.

2. A frequency multiplier in accordance with claim 1 wherein the common mode feedback comprises even harmonics.

3. A frequency multiplier in accordance with claim 2 wherein the even harmonics comprise at least a $2^{nd}$ harmonic.

4. A frequency multiplier in accordance with claim 1 wherein the gain stage comprises a transistor and a source of each transistor in one of a pair of the differential pairs of transistors is connected to a drain of the transistor of the gain stage.

5. A frequency multiplier in accordance with claim 1 wherein a drain of one of each of the differential pairs of transistors is connected to a drain of one of each of the transistors in a different differential pair of the transistors.

6. A frequency multiplier in accordance with claim 1 wherein the gain stage is connected to an output of the switching component and is configured to amplify the common mode feedback.

7. A frequency multiplier in accordance with claim 1 wherein each of the transistors in the differential pairs of transistors is switched on and off during different portions of a cycle of an input signal.

8. A frequency multiplier in accordance with claim 1 further comprising an additional transistor connected to one of the differential pairs of transistors, the additional transistor being DC biased.

9. A frequency multiplier in accordance with claim 1 wherein opposite phases of an input signal are applied to different ones of the transistors in each of the differential pairs of transistors.

10. A frequency multiplier in accordance with claim 1 further comprising a first load connected to one of each of the transistors in the differential pairs of transistors and a second load connect to the other transistor in the differential pairs of transistors.

11. A frequency multiplier comprising:
    a switching component having a plurality of differential pairs of transistors; and
    a gain stage wherein a common mode feedback generated by the switching component is provided to the gain stage, and wherein a single input signal is provided to the switching component and the switching component is configured to generate a frequency multiplied signal having a frequency that is triple the single input signal.

12. An apparatus comprising:
    a signal generator configured to generate an input signal; and
    a frequency multiplier configured to generate a frequency multiplied output signal from a single input signal of the signal generator and having a frequency that is one of three times and five times a frequency of the single input signal, wherein the frequency multiplied output signal is generated using the single input signal and a common-mode feedback signal generated by the frequency multiplier.

13. An apparatus in accordance with claim 12 wherein the frequency multiplier is configured in a balanced topology to compensate for fundamental components generated and the frequency multiplier has no bandpass filter.

14. An apparatus in accordance with claim 12 wherein the frequency multiplied output is a tripled differential signal.

15. An apparatus comprising:
    a signal generator configured to generate an input signal; and a frequency multiplier configured to generate a frequency multiplied output signal from a single input signal of the signal generator and having a frequency that is one of three times and five times a frequency of the single input signal, wherein the frequency multiplier comprises a gain stage configured to amplify a common-mode feedback signal to generate the frequency multiplied output signal.

16. An apparatus comprising:

a signal generator configured to generate an input signal; and a frequency multiplier configured to generate a frequency multiplied output signal from a single input signal of the signal generator and having a frequency that is one of three times and five times a frequency of the single input signal, wherein the frequency multiplier comprises a plurality of differential pairs of transistors providing switching operation to generate in phase harmonics based on the single input signal, the in phase harmonics defining a common-mode feedback used to generate the frequency multiplied output.

17. A method for generating a multiplied frequency signal, the method comprising:

switching pairs of differential transistors with a single input signal;

generating harmonics based on the switching;

generating a common-mode feedback based on even harmonics from the generated harmonics;

amplifying the common-mode feedback harmonics with a gain stage to generate an amplified common-mode signal; and using the amplified common-mode signal combined with the single input signal to generate a multiplied frequency output signal, wherein the multiplied frequency output signal is a signal having triple the frequency of the single input signal.

* * * * *